(12) United States Patent
Chen et al.

(10) Patent No.: US 11,343,015 B2
(45) Date of Patent: May 24, 2022

(54) CHANNEL-AWARE CONSTRUCTION OF POLAR CODES

(71) Applicant: QUALCOMM Incorporated, San Diego, CA (US)

(72) Inventors: Kai Chen, Shenzhen (CN); Liangming Wu, Beijing (CN); Changlong Xu, Beijing (CN); Hao Xu, Beijing (CN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/772,128

(22) PCT Filed: Jan. 10, 2019

(86) PCT No.: PCT/CN2019/071115
§ 371 (c)(1),
(2) Date: Jun. 11, 2020

(87) PCT Pub. No.: WO2019/137415
PCT Pub. Date: Jul. 18, 2019

(65) Prior Publication Data
US 2021/0083795 A1    Mar. 18, 2021

(30) Foreign Application Priority Data

Jan. 12, 2018 (WO) ................ PCT/CN2018/072440

(51) Int. Cl.
*H04L 25/00* (2006.01)
*H04L 1/00* (2006.01)
*H04B 7/0413* (2017.01)

(52) U.S. Cl.
CPC ......... *H04L 1/0009* (2013.01); *H04B 7/0413* (2013.01); *H04L 1/0057* (2013.01)

(58) Field of Classification Search
CPC .... H04B 1/406; H04B 7/0413; H04B 7/0473; H04L 27/0008; H04L 1/0057; H04L 1/0041; H04W 72/042; H04W 72/0406
USPC ......................................................... 375/216
See application file for complete search history.

(56) References Cited

U.S. PATENT DOCUMENTS

| | | | |
|---|---|---|---|
| 2011/0317615 A1* | 12/2011 | Soong | H04W 4/12 370/315 |
| 2017/0047947 A1* | 2/2017 | Hong | H03M 13/2906 |
| 2018/0199350 A1* | 7/2018 | John Wilson | H04L 1/0072 |

FOREIGN PATENT DOCUMENTS

| | | |
|---|---|---|
| CN | 103916220 A | 7/2014 |
| CN | 105897379 A | 8/2016 |
| CN | 106130690 A | 11/2016 |
| CN | 106341208 A | 1/2017 |
| CN | 106982070 A | 7/2017 |
| CN | 107370564 A | 11/2017 |
| EP | 2299623 A2 | 3/2011 |
| EP | 3376695 A1 | 9/2018 |

(Continued)

OTHER PUBLICATIONS

AT&T: "Polar Code Construction for Control Channels", 3GPP TSG RAN WG1 Meeting #89, R1-1707747, May 19, 2017, 2 pages.

(Continued)

*Primary Examiner* — Khai Tran
(74) *Attorney, Agent, or Firm* — Patterson + Sheridan, L.L.P.

(57) ABSTRACT

Certain aspects of the present disclosure relate to methods and apparatus for channel-war polar code construction.

30 Claims, 13 Drawing Sheets

(56) References Cited

FOREIGN PATENT DOCUMENTS

WO       2017101631 A1    6/2017
WO       2017197358 A1   11/2017

OTHER PUBLICATIONS

International Search Report and Written Opinion—PCT/CN2018/072440—ISA/EPO—dated Oct. 11, 2018.
International Search Report and Written Opinion—PCT/CN2019/071115—ISA/EPO—dated Apr. 10, 2019.
NTT Docomo: "Polar Coding for CSI Reporting", R1-1720829, 3GPP TSG RAN WG1 Meeting 91, Dec. 1, 2017 (Dec. 1, 2017), pp. 1-4.
Jing S., et al., "Graph-Merged Detection and Decoding of Polar-Coded MIMO Systems", 2017 9th International Conference on Wireless Communications and Signal Processing (WCSP), IEEE, Oct. 11, 2017 (Oct. 11, 2017), 6 pages, XP033264390, DOI:10.1109/WCSP.2017.8171002 [retrieved on Dec. 7, 2017], section II.
Qualcomm Incorporated: "Polar Code Design Overview", 3GPP Draft, 3GPP TSG-RAN WG1 #85, R1-164699_Polar_Design_Overview, 3rd Generation Partnership Project (3GPP), Mobile Competence Centre, 650, Route Des Lucioles, F-06921 Sophia-Antipolis Cedex, France, vol. RAN WG1, No. Nanjing, China, May 23, 2016-May 27, 2016, May 14, 2016 (May 14, 2016), XP051089936, 3 pages, Retrieved from the Internet: URL: http://www.3gpp.org/ftp/tsg_ran/WG1_RL1/TSGR1_85/Docs/, sections 2-4.
Supplementary European Search Report—EP19738691—Search Authority—Munich—dated Sep. 3, 2021.

\* cited by examiner

CHANNEL-AWARE CONSTRUCTION OF POLAR CODES

CROSS-REFERENCE TO RELATED APPLICATION & PRIORITY CLAIM

This application is a national stage application under 35 U.S.C. 371 of PCT/CN2019/071115, filed Jan. 10, 2019, which claims the benefit of and priority to International Patent Cooperation Treaty Application No. PCT/CN2018/072440, filed Jan. 12, 2018, which are hereby assigned to the assignee hereof and hereby expressly incorporated by reference herein as if fully set forth below and for all applicable purposes.

FIELD

The present disclosure relates generally to communication systems, and more particularly, to methods and apparatus for adapting polar code construction to channel conditions.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power). Examples of such multiple-access technologies include Long Term Evolution (LTE) systems, code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

In some examples, a wireless multiple-access communication system may include a number of base stations, each simultaneously supporting communication for multiple communication devices, otherwise known as user equipment (UEs). In LTE or LTE-A network, a set of one or more base stations may define an eNodeB (eNB). In other examples (e.g., in a next generation or 5G network), a wireless multiple access communication system may include a number of distributed units (DUs) (e.g., edge units (EUs), edge nodes (ENs), radio heads (RHs), smart radio heads (SRHs), transmission reception points (TRPs), etc.) in communication with a number of central units (CUs) (e.g., central nodes (CNs), access node controllers (ANCs), etc.), where a set of one or more distributed units, in communication with a central unit, may define an access node (e.g., a new radio base station (NR BS), a new radio node-B (NR NB), a network node, 5G NB, eNB, etc.). A base station or DU may communicate with a set of UEs on downlink channels (e.g., for transmissions from a base station or to a UE) and uplink channels (e.g., for transmissions from a UE to a base station or distributed unit).

These multiple access technologies have been adopted in various telecommunication standards to provide a common protocol that enables different wireless devices to communicate on a municipal, national, regional, and even global level. An example of an emerging telecommunication standard is new radio (NR), for example, 5G radio access. NR is a set of enhancements to the LTE mobile standard promulgated by Third Generation Partnership Project (3GPP). NR is designed to better support mobile broadband Internet access by improving spectral efficiency, lowering costs, improving services, making use of new spectrum, and better integrating with other open standards using OFDMA with a cyclic prefix (CP) on the downlink (DL) and on the uplink (UL) as well as support beamforming, multiple-input multiple-output (MIMO) antenna technology, and carrier aggregation.

However, as the demand for mobile broadband access continues to increase, there exists a desire for further improvements in NR technology. Preferably, these improvements should be applicable to other multi-access technologies and the telecommunication standards that employ these technologies.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved communications between access points and stations in a wireless network.

Certain aspects provide a method for wireless communication. The method generally includes selecting a set of polar code parameters based on a payload size, resource size, and information regarding a bit channel to be used for transmission on one or more multiple input multiple output (MIMO) layers, encoding the stream of bits using the selected polar code parameters, and transmitting the encoded stream of bits.

Aspects generally include methods, apparatus, systems, computer readable mediums, and processing systems, as substantially described herein with reference to and as illustrated by the accompanying drawings.

To the accomplishment of the foregoing and related ends, the one or more aspects include the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

Figure 1:
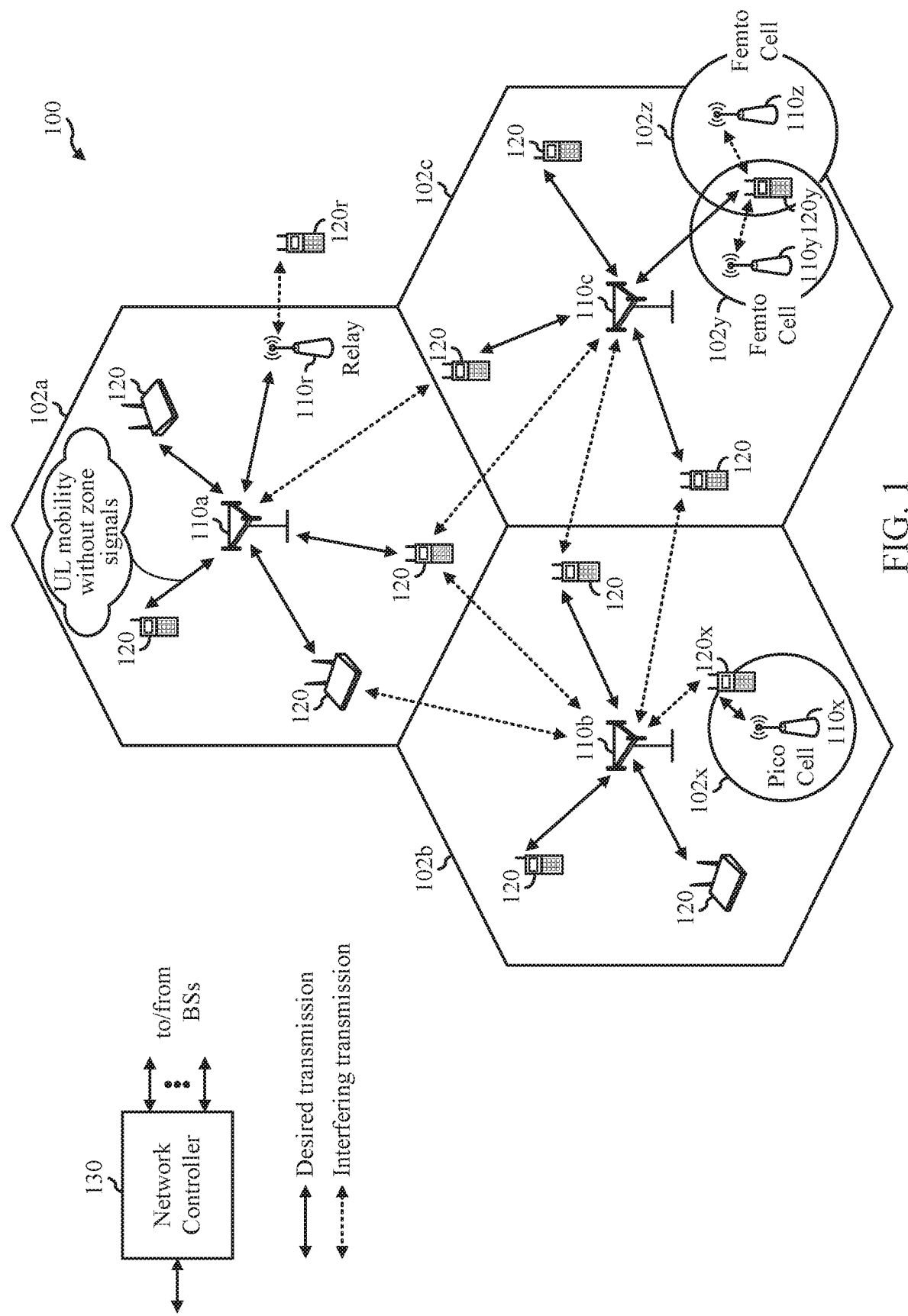
FIG. 1 is a block diagram conceptually illustrating an example telecommunications system, in accordance with certain aspects of the present disclosure.

To facilitate understanding, identical reference numerals have been used, where possible, to designate identical elements that are common to the figures. It is contemplated that elements described in one aspect may be beneficially utilized on other aspects without specific recitation. Aspects generally include methods, apparatus, systems, computer program products, computer-readable medium, and processing systems, as substantially described herein with reference to and as illustrated by the accompanying drawings.

DETAILED DESCRIPTION

Aspects of the present disclosure provide apparatus, methods, processing systems, and computer readable mediums for NR (new radio access technology or 5G technology).

NR may support various wireless communication services, such as Enhanced mobile broadband (eMBB) targeting wide bandwidth (e.g. 80 MHz beyond), millimeter wave (mmW) targeting high carrier frequency (e.g. 27 GHz or beyond), massive MTC (mMTC) targeting non-backward compatible MTC techniques, and/or mission critical targeting ultra-reliable low latency communications (URLLC). These services may include latency and reliability requirements. These services may also have different transmission time intervals (TTI) to meet respective quality of service (QoS) requirements. In addition, these services may co-exist in the same subframe.

In NR, polar codes may be used for forward error correction (FEC) to encode information transmitted on control channels. Generally, in polar encoding, the most reliable channels are selected to carry information, and the rest of the bits are set to a fixed value (e.g., such as 0), which are referred to as "frozen bits". In some systems, such as NR, there may be situations in which a higher aggregation level control message (e.g., NR physical downlink control channel (PDCCH) message) can be decoded (e.g., by a UE) as a lower aggregation level control message. However, as described in more detail below, such situations may present issues when the UE attempts to determine information that is based in part on the resources used for the NR-PDCCH message.

In one reference example, if a particular control channel element (CCE) location (e.g., last CCE index) of the NR-PDCCH message is associated with the physical uplink control channel (PUCCH) allocation, the UE may not be able to reliably determine the PUCCH allocation in cases where the UE decodes the higher AL control message (e.g., AL-16 NR-PDCCH) in a subset of the CCEs used for the higher AL control message. In another reference example, if the control resource set (coreset) is being reused by PDSCH, the UE may not be able to know the exact PDCCH CCE usage, e.g., in order to rate match PDSCH around the used CCEs.

Accordingly, aspects provide techniques and apparatus for resolving potential ambiguities that may arise in situations where a higher AL control message is decodable as a lower AL control message.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure described herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The techniques described herein may be used for various wireless communication networks such as LTE, CDMA, TDMA, FDMA, OFDMA, SC-FDMA and other networks. The terms "network" and "system" are often used interchangeably. A CDMA network may implement a radio technology such as Universal Terrestrial Radio Access (UTRA), cdma2000, etc. UTRA includes Wideband CDMA (WCDMA) and other variants of CDMA. cdma2000 covers IS-2000, IS-95 and IS-856 standards. A TDMA network may implement a radio technology such as Global System for Mobile Communications (GSM). An OFDMA network may implement a radio technology such as NR (e.g. 5G RA), Evolved UTRA (E-UTRA), Ultra Mobile Broadband (UMB), IEEE 802.11 (Wi-Fi), IEEE 802.16 (WiMAX), IEEE 802.20, Flash-OFDMA, etc. UTRA and E-UTRA are part of Universal Mobile Telecommunication System (UMTS). NR is an emerging wireless communications technology under development in conjunction with the 5G Technology Forum (5GTF). 3GPP Long Term Evolution (LTE) and LTE-Advanced (LTE-A) are releases of UMTS that use E-UTRA. UTRA, E-UTRA, UMTS, LTE, LTE-A and GSM are described in documents from an organization named "3rd Generation Partnership Project" (3GPP). cdma2000 and UMB are described in documents from an organization named "3rd Generation Partnership Project 2" (3GPP2). "LTE" refers generally to LTE, LTE-Advanced (LTE-A), LTE in an unlicensed spectrum (LTE-whitespace), etc. The techniques described herein may be used for the wireless networks and radio technologies mentioned above as well as other wireless networks and radio technologies. For clarity, while aspects may be described herein using terminology commonly associated with 3G and/or 4G wireless technologies, aspects of the present disclosure can be applied in other generation-based communication systems, such as 5G and later, including NR technologies.

Example Wireless Communications System

FIG. 1 illustrates an example wireless network 100, such as a new radio (NR) or 5G network, in which aspects of the present disclosure may be performed. For example, a BS 110 or UE 120 may perform polar encoding/decoding according to the techniques described herein.

As illustrated in FIG. 1, the wireless network 100 may include a number of BSs 110 and other network entities. A BS may be a station that communicates with UEs. Each BS 110 may provide communication coverage for a particular geographic area. In 3GPP, the term "cell" can refer to a coverage area of a Node B and/or a Node B subsystem serving this coverage area, depending on the context in which the term is used. In NR systems, the term "cell" and eNB, Node B, 5G NB, AP, NR BS, NR BS, or TRP may be interchangeable. In some examples, a cell may not necessarily be stationary, and the geographic area of the cell may move according to the location of a mobile base station. In some examples, the base stations may be interconnected to one another and/or to one or more other base stations or network nodes (not shown) in the wireless network 100 through various types of backhaul interfaces such as a direct physical connection, a virtual network, or the like using any suitable transport network.

In general, any number of wireless networks may be deployed in a given geographic area. Each wireless network may support a particular radio access technology (RAT) and may operate on one or more frequencies. A RAT may also be referred to as a radio technology, an air interface, etc. A frequency may also be referred to as a carrier, a frequency channel, etc. Each frequency may support a single RAT in a given geographic area in order to avoid interference between wireless networks of different RATs. In some cases, NR or 5G RAT networks may be deployed.

A BS may provide communication coverage for a macro cell, a pico cell, a femto cell, and/or other types of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a Closed Subscriber Group (CSG), UEs for users in the home, etc.). A BS for a macro cell may be referred to as a macro BS. A BS for a pico cell may be referred to as a pico BS. A BS for a femto cell may be referred to as a femto BS or a home BS. In the example shown in FIG. 1, the BSs 110a, 110b and 110c may be macro BSs for the macro cells 102a, 102b and 102c, respectively. The BS 110x may be a pico BS for a pico cell 102x. The BSs 110y and 110z may be femto BS for the femto cells 102y and 102z, respectively. A BS may support one or multiple (e.g., three) cells.

The wireless network 100 may also include relay stations. A relay station is a station that receives a transmission of data and/or other information from an upstream station (e.g., a BS or a UE) and sends a transmission of the data and/or other information to a downstream station (e.g., a UE or a BS). A relay station may also be a UE that relays transmissions for other UEs. In the example shown in FIG. 1, a relay station 110r may communicate with the BS 110a and a UE 120r in order to facilitate communication between the BS 110a and the UE 120r. A relay station may also be referred to as a relay BS, a relay, etc.

The wireless network 100 may be a heterogeneous network that includes BSs of different types, e.g., macro BS, pico BS, femto BS, relays, etc. These different types of BSs may have different transmit power levels, different coverage areas, and different impact on interference in the wireless network 100. For example, macro BS may have a high transmit power level (e.g., 20 Watts) whereas pico BS, femto BS, and relays may have a lower transmit power level (e.g., 1 Watt).

The wireless network 100 may support synchronous or asynchronous operation. For synchronous operation, the BSs may have similar frame timing, and transmissions from different BSs may be approximately aligned in time. For asynchronous operation, the BSs may have different frame timing, and transmissions from different BSs may not be aligned in time. The techniques described herein may be used for both synchronous and asynchronous operation.

A network controller 130 may be coupled to a set of BSs and provide coordination and control for these BSs. The network controller 130 may communicate with the BSs 110 via a backhaul. The BSs 110 may also communicate with one another, e.g., directly or indirectly via wireless or wireline backhaul.

The UEs 120 (e.g., 120x, 120y, etc.) may be dispersed throughout the wireless network 100, and each UE may be stationary or mobile. A UE may also be referred to as a mobile station, a terminal, an access terminal, a subscriber unit, a station, a Customer Premises Equipment (CPE), a cellular phone, a smart phone, a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device or medical equipment, a healthcare device, a biometric sensor/device, a wearable device such as a smart watch, smart clothing, smart glasses, virtual reality goggles, a smart wrist band, smart jewelry (e.g., a smart ring, a smart bracelet, etc.), an entertainment device (e.g., a music device, a video device, a satellite radio, etc.), a vehicular component or sensor, a smart meter/sensor, a robot, a drone, industrial manufacturing equipment, a positioning device (e.g., GPS, Beidou, terrestrial), or any other suitable device that is configured to communicate via a wireless or wired medium. Some UEs may be considered machine-type communication (MTC) devices or evolved MTC (eMTC) devices, which may include remote devices that may communicate with a base station, another remote device, or some other entity. Machine type communications (MTC) may refer to communication involving at least one remote device on at least one end of the communication and may include forms of data communication which involve one or more entities that do not necessarily need human interaction. MTC UEs may include UEs that are capable of MTC communications with MTC servers and/or other MTC devices through Public Land Mobile Networks (PLMN), for example. MTC and eMTC UEs include, for example, robots, drones, remote devices, sensors, meters, monitors, cameras, location tags, etc., that may communicate with a BS, another device (e.g., remote device), or some other entity. A wireless node may provide, for example, connectivity for or to a network (e.g., a wide area network such as Internet or a cellular network) via a wired or wireless communication link. MTC UEs, as well as other UEs, may be implemented as Internet-of-Things (IoT) devices, e.g., narrowband IoT (NB-IoT) devices.

In FIG. 1, a solid line with double arrows indicates desired transmissions between a UE and a serving BS, which is a BS designated to serve the UE on the downlink and/or uplink. A dashed line with double arrows indicates interfering transmissions between a UE and a BS.

Certain wireless networks (e.g., LTE) utilize orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz and the minimum resource allocation (called a 'resource block') may be 12 subcarriers (or 180 kHz). Consequently, the nominal FFT size may be equal to 128, 256, 512, 1024 or 2048 for system bandwidth of 1.25, 2.5, 5, 10 or 20 megahertz (MHz), respectively. The system bandwidth may also be partitioned into subbands. For example, a subband may cover 1.08 MHz (e.g., 6 resource blocks), and there may be 1, 2, 4, 8 or 16 subbands for system bandwidth of 1.25, 2.5, 5, 10 or 20 MHz, respectively.

While aspects of the examples described herein may be associated with LTE technologies, aspects of the present disclosure may be applicable with other wireless communications systems, such as NR. NR may utilize OFDM with a CP on the uplink and downlink and include support for half-duplex operation using time division duplex (TDD). A single component carrier bandwidth of 100 MHz may be supported. NR resource blocks may span 12 sub-carriers with a sub-carrier bandwidth of 75 kHz over a 0.1 ms duration. Each radio frame may consist of 2 half frames, each half frame consisting of 5 subframes, with a length of 10 ms. Consequently, each subframe may have a length of 1 ms. Each subframe may indicate a link direction (e.g., DL or UL) for data transmission and the link direction for each subframe may be dynamically switched. Each subframe may include DL/UL data as well as DL/UL control data. UL and DL subframes for NR may be as described in more detail below with respect to FIGS. 6 and 7. Beamforming may be supported and beam direction may be dynamically configured. MIMO transmissions with precoding may also be supported. MIMO configurations in the DL may support up to 8 transmit antennas with multi-layer DL transmissions up to 8 streams and up to 2 streams per UE. Multi-layer transmissions with up to 2 streams per UE may be supported. Aggregation of multiple cells may be supported with up to 8 serving cells. Alternatively, NR may support a different air interface, other than an OFDM-based. NR networks may include entities such CUs and/or DUs.

In some examples, access to the air interface may be scheduled, wherein a scheduling entity (e.g., a base station) allocates resources for communication among some or all devices and equipment within the scheduling entity's service area or cell. Within the present disclosure, as discussed further below, the scheduling entity may be responsible for scheduling, assigning, reconfiguring, and releasing resources for one or more subordinate entities. That is, for scheduled communication, subordinate entities utilize resources allocated by the scheduling entity. Base stations are not the only entities that may function as a scheduling entity. That is, in some examples, a UE may function as a scheduling entity, scheduling resources for one or more subordinate entities (e.g., one or more other UEs). In this example, the UE is functioning as a scheduling entity, and other UEs utilize resources scheduled by the UE for wireless communication. A UE may function as a scheduling entity in a peer-to-peer (P2P) network, and/or in a mesh network. In a mesh network example, UEs may optionally communicate directly with one another in addition to communicating with the scheduling entity.

Thus, in a wireless communication network with a scheduled access to time-frequency resources and having a cellular configuration, a P2P configuration, and a mesh configuration, a scheduling entity and one or more subordinate entities may communicate utilizing the scheduled resources.

As noted above, a RAN may include a CU and DUs. A NR BS (e.g., eNB, 5G Node B, Node B, transmission reception point (TRP), access point (AP)) may correspond to one or multiple BSs. NR cells may be configured as access cell (ACells) or data only cells (DCells). For example, the RAN (e.g., a central unit or distributed unit) may configure the cells. DCells may be cells used for carrier aggregation or dual connectivity, but not used for initial access, cell selection/reselection, or handover. In some cases DCells may not transmit synchronization signals—in some case cases DCells may transmit SS. NR BSs may transmit downlink signals to UEs indicating the cell type. Based on the cell type indication, the UE may communicate with the NR BS. For example, the UE may determine NR BSs to consider for cell selection, access, handover, and/or measurement based on the indicated cell type.

Figure 2:
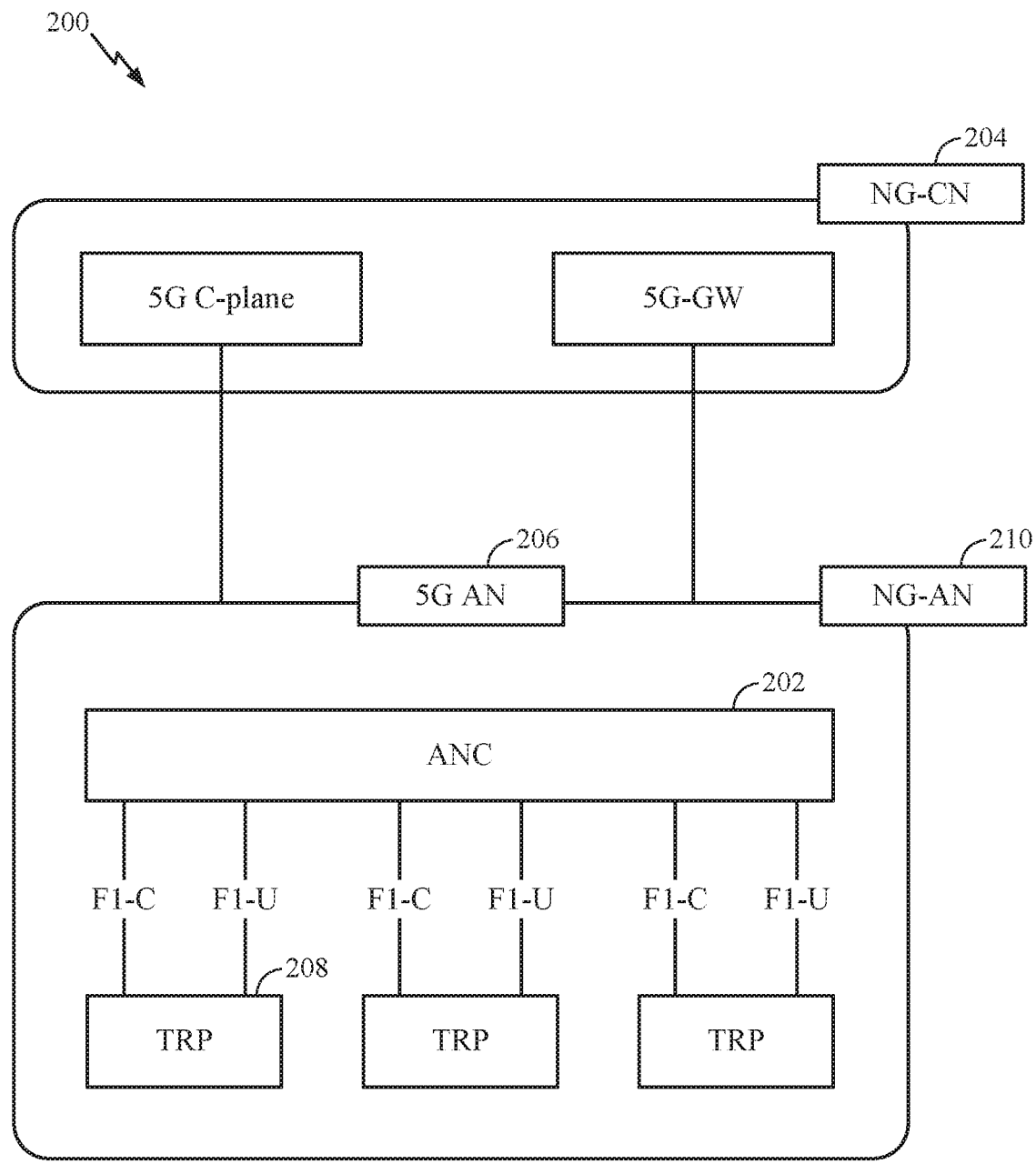
FIG. 2 is a block diagram illustrating an example logical architecture of a distributed RAN, in accordance with certain aspects of the present disclosure.

FIG. 2 illustrates an example logical architecture of a distributed radio access network (RAN) 200, which may be implemented in the wireless communication system illustrated in FIG. 1. A 5G access node 206 may include an access node controller (ANC) 202. The ANC may be a central unit (CU) of the distributed RAN 200. The backhaul interface to the next generation core network (NG-CN) 204 may terminate at the ANC. The backhaul interface to neighboring next generation access nodes (NG-ANs) may terminate at the ANC. The ANC may include one or more TRPs 208 (which may also be referred to as BSs, NR BSs, Node Bs, 5G NBs, APs, or some other term). As described above, a TRP may be used interchangeably with "cell."

The TRPs 208 may be a DU. The TRPs may be connected to one ANC (ANC 202) or more than one ANC (not illustrated). For example, for RAN sharing, radio as a service (RaaS), and service specific AND deployments, the TRP may be connected to more than one ANC. A TRP may include one or more antenna ports. The TRPs may be configured to individually (e.g., dynamic selection) or jointly (e.g., joint transmission) serve traffic to a UE.

The local architecture 200 may be used to illustrate fronthaul definition. The architecture may be defined that support fronthauling solutions across different deployment types. For example, the architecture may be based on transmit network capabilities (e.g., bandwidth, latency, and/or jitter).

The architecture may share features and/or components with LTE. According to aspects, the next generation AN (NG-AN) 210 may support dual connectivity with NR. The NG-AN may share a common fronthaul for LTE and NR.

The architecture may enable cooperation between and among TRPs 208. For example, cooperation may be preset within a TRP and/or across TRPs via the ANC 202. According to aspects, no inter-TRP interface may be needed/present.

According to aspects, a dynamic configuration of split logical functions may be present within the architecture 200. As will be described in more detail with reference to FIG. 5, the Radio Resource Control (RRC) layer, Packet Data Convergence Protocol (PDCP) layer, Radio Link Control (RLC) layer, Medium Access Control (MAC) layer, and a Physical (PHY) layers may be adaptably placed at the DU or CU (e.g., TRP or ANC, respectively). According to certain aspects, a BS may include a central unit (CU) (e.g., ANC 202) and/or one or more distributed units (e.g., one or more TRPs 208).

Figure 3:
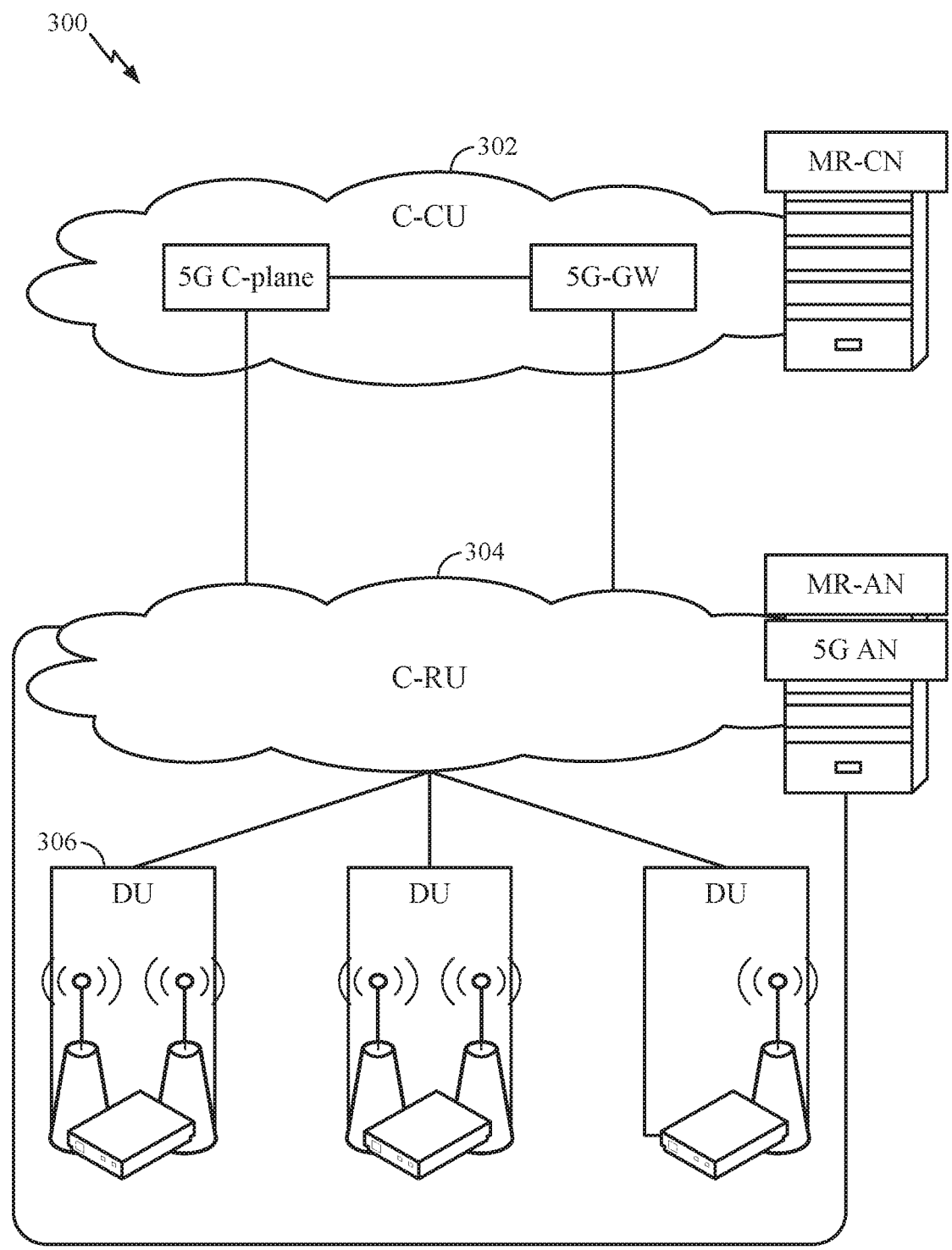
FIG. 3 is a diagram illustrating an example physical architecture of a distributed RAN, in accordance with certain aspects of the present disclosure.

FIG. 3 illustrates an example physical architecture of a distributed RAN 300, according to aspects of the present disclosure. A centralized core network unit (C-CU) 302 may host core network functions. The C-CU may be centrally deployed. C-CU functionality may be offloaded (e.g., to advanced wireless services (AWS)), in an effort to handle peak capacity.

A centralized RAN unit (C-RU) 304 may host one or more ANC functions. Optionally, the C-RU may host core network functions locally. The C-RU may have distributed deployment. The C-RU may be closer to the network edge.

A DU 306 may host one or more TRPs (edge node (EN), an edge unit (EU), a radio head (RH), a smart radio head (SRH), or the like). The DU may be located at edges of the network with radio frequency (RF) functionality.

Figure 4:
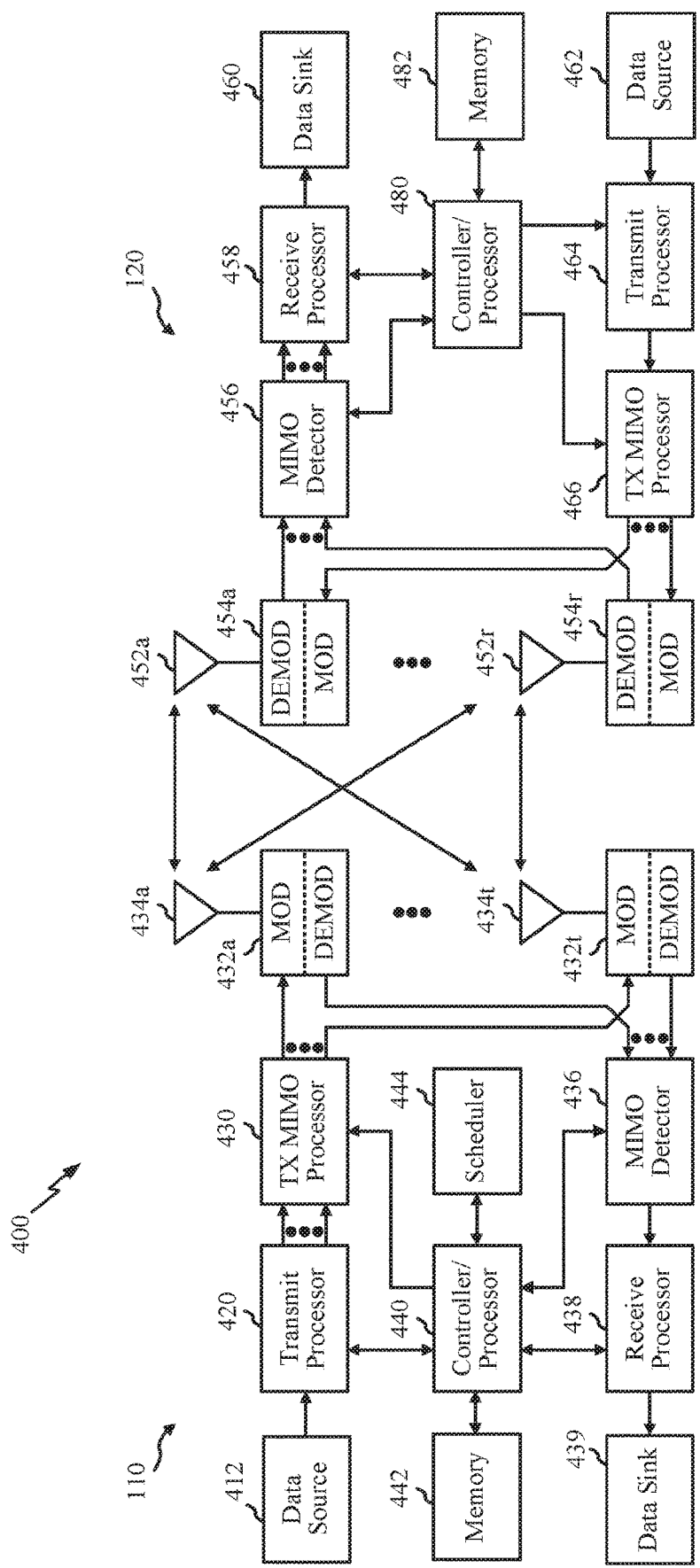
FIG. 4 is a block diagram conceptually illustrating a design of an example BS and user equipment (UE), in accordance with certain aspects of the present disclosure.

FIG. 4 illustrates example components of the BS 110 and UE 120 illustrated in FIG. 1, which may be used to implement aspects of the present disclosure. As described above, the BS may include a TRP. One or more components of the BS 110 and UE 120 may be used to practice aspects of the present disclosure. For example, antennas 452, Tx/Rx 222, processors 466, 458, 464, and/or controller/processor 480 of the UE 120 and/or antennas 434, processors 460, 420, 438, and/or controller/processor 440 of the BS 110 may be used to perform the operations described herein.

FIG. 4 shows a block diagram of a design of a BS 110 and a UE 120, which may be one of the BSs and one of the UEs in FIG. 1. For a restricted association scenario, the base station 110 may be the macro BS 110c in FIG. 1, and the UE 120 may be the UE 120y. The base station 110 may also be a base station of some other type. The base station 110 may be equipped with antennas 434a through 434t, and the UE 120 may be equipped with antennas 452a through 452r.

At the base station 110, a transmit processor 420 may receive data from a data source 412 and control information from a controller/processor 440. The control information may be for the Physical Broadcast Channel (PBCH), Physical Control Format Indicator Channel (PCFICH), Physical Hybrid ARQ Indicator Channel (PHICH), Physical Downlink Control Channel (PDCCH), etc. The data may be for the Physical Downlink Shared Channel (PDSCH), etc. The processor 420 may process (e.g., encode and symbol map) the data and control information to obtain data symbols and control symbols, respectively. The processor 420 may also generate reference symbols, e.g., for the PSS, SSS, and cell-specific reference signal. A transmit (TX) multiple-input multiple-output (MIMO) processor 430 may perform spatial processing (e.g., precoding) on the data symbols, the control symbols, and/or the reference symbols, if applicable, and may provide output symbol streams to the modulators (MODs) 432a through 432t. For example, the TX MIMO processor 430 may perform certain aspects described herein for RS multiplexing. Each modulator 432 may process a respective output symbol stream (e.g., for OFDM, etc.) to obtain an output sample stream. Each modulator 432 may further process (e.g., convert to analog, amplify, filter, and upconvert) the output sample stream to obtain a downlink signal. Downlink signals from modulators 432a through 432t may be transmitted via the antennas 434a through 434t, respectively.

At the UE 120, the antennas 452a through 452r may receive the downlink signals from the base station 110 and may provide received signals to the demodulators (DE-MODs) 454a through 454r, respectively. Each demodulator 454 may condition (e.g., filter, amplify, downconvert, and digitize) a respective received signal to obtain input samples. Each demodulator 454 may further process the input samples (e.g., for OFDM, etc.) to obtain received symbols. A MIMO detector 456 may obtain received symbols from all the demodulators 454a through 454r, perform MIMO detection on the received symbols if applicable, and provide detected symbols. For example, MIMO detector 456 may provide detected RS transmitted using techniques described herein. A receive processor 458 may process (e.g., demodulate, deinterleave, and decode) the detected symbols, provide decoded data for the UE 120 to a data sink 460, and provide decoded control information to a controller/processor 480. According to one or more cases, CoMP aspects may include providing the antennas, as well as some Tx/Rx functionalities, such that they reside in distributed units. For example, some Tx/Rx processings may be done in the central unit, while other processing may be done at the distributed units. For example, in accordance with one or more aspects as shown in the diagram, the BS mod/demod 432 may be in the distributed units.

On the uplink, at the UE 120, a transmit processor 464 may receive and process data (e.g., for the Physical Uplink Shared Channel (PUSCH)) from a data source 462 and control information (e.g., for the Physical Uplink Control Channel (PUCCH) from the controller/processor 480. The transmit processor 464 may also generate reference symbols for a reference signal. The symbols from the transmit processor 464 may be precoded by a TX MIMO processor 466 if applicable, further processed by the demodulators 454a through 454r (e.g., for SC-FDM, etc.), and transmitted to the base station 110. At the BS 110, the uplink signals from the UE 120 may be received by the antennas 434, processed by the modulators 432, detected by a MIMO detector 436 if applicable, and further processed by a receive processor 438 to obtain decoded data and control information sent by the UE 120. The receive processor 438 may provide the decoded data to a data sink 439 and the decoded control information to the controller/processor 440.

The controllers/processors 440 and 480 may direct the operation at the base station 110 and the UE 120, respectively. The processor 440 and/or other processors and modules at the base station 110 may perform or direct, e.g., the execution of the functional blocks illustrated in FIG. 10 and/or other processes for the techniques described herein. The processor 480 and/or other processors and modules at the UE 120 may also perform or direct, e.g., the execution of the functional blocks illustrated in FIG. 11 and/or other processes for the techniques described herein. The memories 442 and 482 may store data and program codes for the BS

110 and the UE 120, respectively. A scheduler 444 may schedule UEs for data transmission on the downlink and/or uplink.

Figure 5:
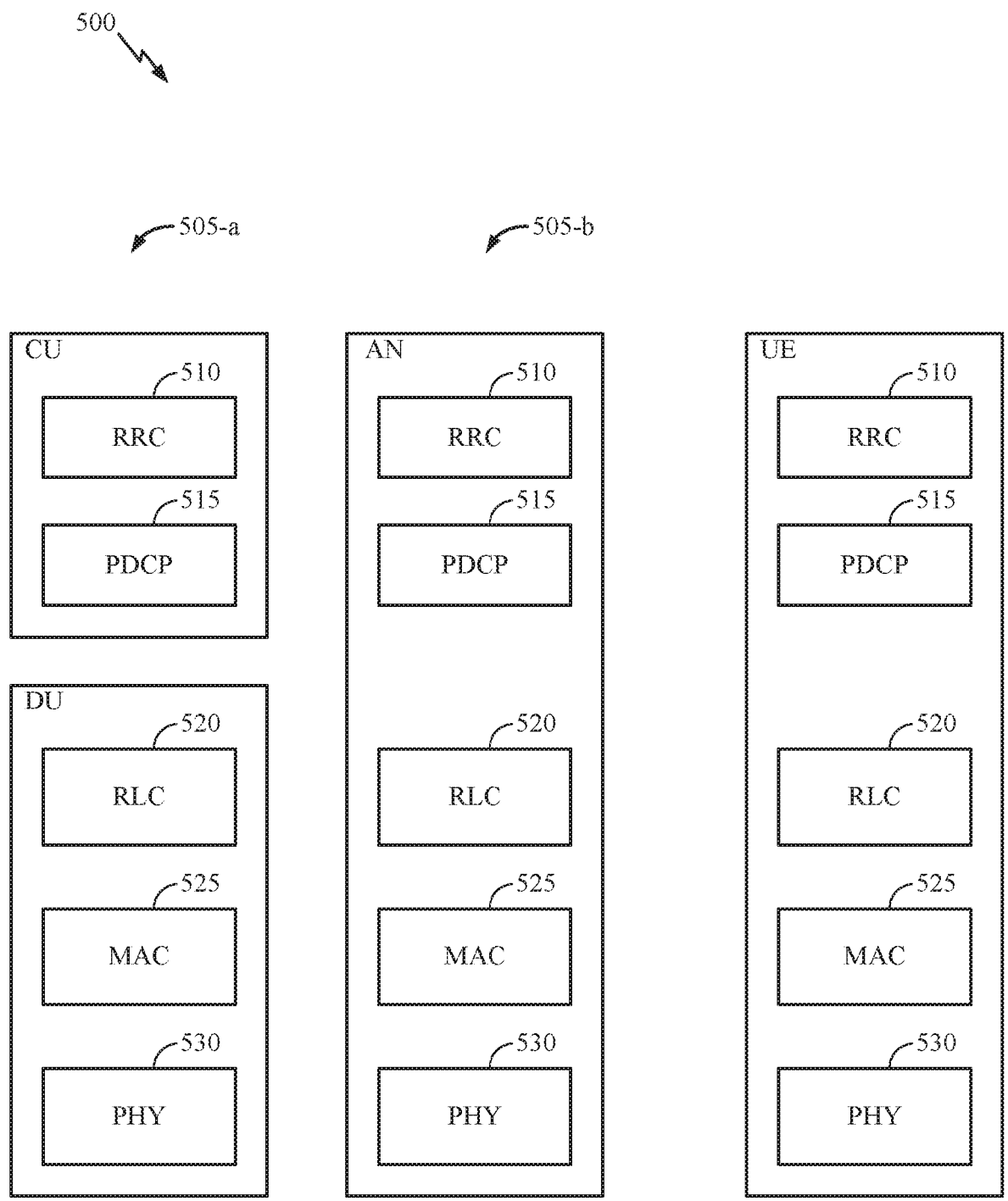
FIG. 5 is a diagram showing examples for implementing a communication protocol stack, in accordance with certain aspects of the present disclosure.

FIG. 5 illustrates a diagram 500 showing examples for implementing a communications protocol stack, according to aspects of the present disclosure. The illustrated communications protocol stacks may be implemented by devices operating in a in a 5G system (e.g., a system that supports uplink-based mobility). Diagram 500 illustrates a communications protocol stack including a Radio Resource Control (RRC) layer 510, a Packet Data Convergence Protocol (PDCP) layer 515, a Radio Link Control (RLC) layer 520, a Medium Access Control (MAC) layer 525, and a Physical (PHY) layer 530. In various examples the layers of a protocol stack may be implemented as separate modules of software, portions of a processor or ASIC, portions of non-collocated devices connected by a communications link, or various combinations thereof. Collocated and non-collocated implementations may be used, for example, in a protocol stack for a network access device (e.g., ANs, CUs, and/or DUs) or a UE.

A first option 505-a shows a split implementation of a protocol stack, in which implementation of the protocol stack is split between a centralized network access device (e.g., an ANC 202 in FIG. 2) and distributed network access device (e.g., DU 208 in FIG. 2). In the first option 505-a, an RRC layer 510 and a PDCP layer 515 may be implemented by the central unit, and an RLC layer 520, a MAC layer 525, and a PHY layer 530 may be implemented by the DU. In various examples the CU and the DU may be collocated or non-collocated. The first option 505-a may be useful in a macro cell, micro cell, or pico cell deployment.

A second option 505-b shows a unified implementation of a protocol stack, in which the protocol stack is implemented in a single network access device (e.g., access node (AN), new radio base station (NR BS), a new radio Node-B (NR NB), a network node (NN), or the like.). In the second option, the RRC layer 510, the PDCP layer 515, the RLC layer 520, the MAC layer 525, and the PHY layer 530 may each be implemented by the AN. The second option 505-b may be useful in a femto cell deployment.

Regardless of whether a network access device implements part or all of a protocol stack, a UE may implement an entire protocol stack (e.g., the RRC layer 510, the PDCP layer 515, the RLC layer 520, the MAC layer 525, and the PHY layer 530).

Figure 6:
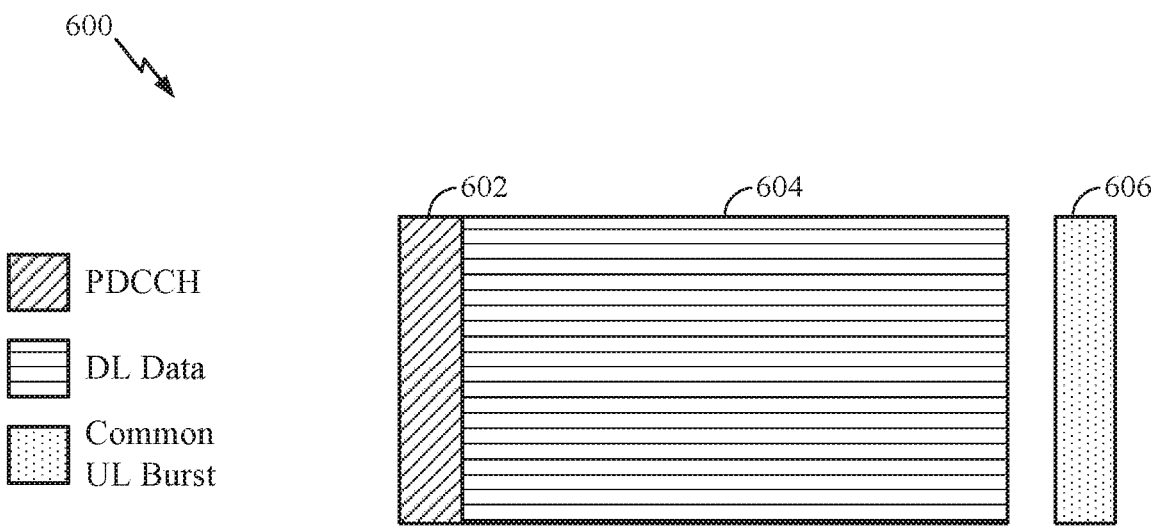
FIG. 6 illustrates an example of a downlink-centric subframe, in accordance with certain aspects of the present disclosure.

FIG. 6 is a diagram 600 showing an example of a DL-centric subframe. The DL-centric subframe may include a control portion 602. The control portion 602 may exist in the initial or beginning portion of the DL-centric subframe. The control portion 602 may include various scheduling information and/or control information corresponding to various portions of the DL-centric subframe. In some configurations, the control portion 602 may be a physical DL control channel (PDCCH), as indicated in FIG. 6. The DL-centric subframe may also include a DL data portion 604. The DL data portion 604 may sometimes be referred to as the payload of the DL-centric subframe. The DL data portion 604 may include the communication resources utilized to communicate DL data from the scheduling entity (e.g., UE or BS) to the subordinate entity (e.g., UE). In some configurations, the DL data portion 604 may be a physical DL shared channel (PDSCH).

The DL-centric subframe may also include a common UL portion 606. The common UL portion 606 may sometimes be referred to as an UL burst, a common UL burst, and/or various other suitable terms. The common UL portion 606 may include feedback information corresponding to various other portions of the DL-centric subframe. For example, the common UL portion 606 may include feedback information corresponding to the control portion 602. Non-limiting examples of feedback information may include an ACK signal, a NACK signal, a HARQ indicator, and/or various other suitable types of information. The common UL portion 606 may include additional or alternative information, such as information pertaining to random access channel (RACH) procedures, scheduling requests (SRs), and various other suitable types of information. As illustrated in FIG. 6, the end of the DL data portion 604 may be separated in time from the beginning of the common UL portion 606. This time separation may sometimes be referred to as a gap, a guard period, a guard interval, and/or various other suitable terms. This separation provides time for the switch-over from DL communication (e.g., reception operation by the subordinate entity (e.g., UE)) to UL communication (e.g., transmission by the subordinate entity (e.g., UE)). One of ordinary skill in the art will understand that the foregoing is merely one example of a DL-centric subframe and alternative structures having similar features may exist without necessarily deviating from the aspects described herein.

Figure 7:
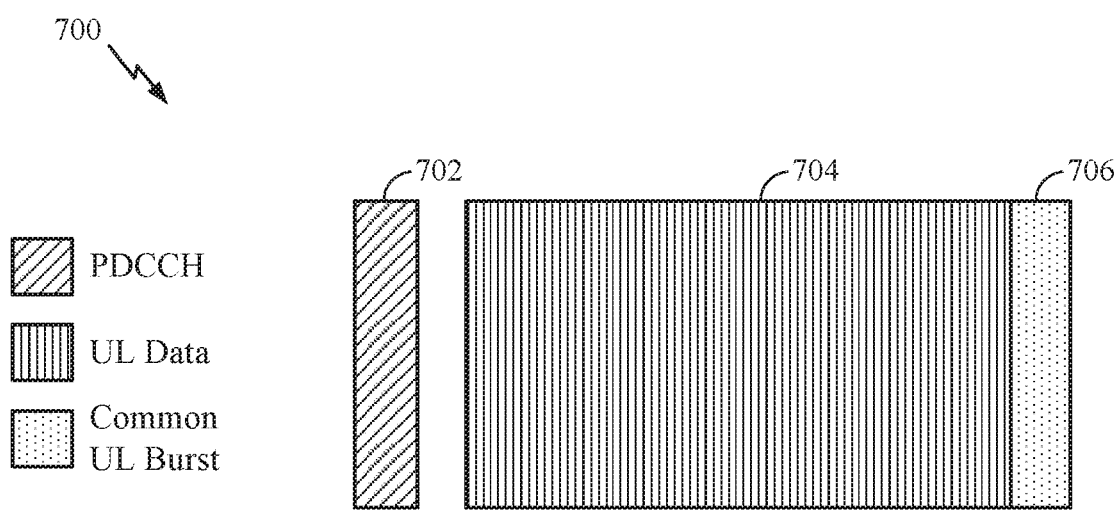
FIG. 7 illustrates an example of an uplink-centric subframe, in accordance with certain aspects of the present disclosure.

FIG. 7 is a diagram 700 showing an example of an UL-centric subframe. The UL-centric subframe may include a control portion 702. The control portion 702 may exist in the initial or beginning portion of the UL-centric subframe. The control portion 702 in FIG. 7 may be similar to the control portion 602 described above with reference to FIG. 6. The UL-centric subframe may also include an UL data portion 704. The UL data portion 704 may sometimes be referred to as the payload of the UL-centric subframe. The UL portion may refer to the communication resources utilized to communicate UL data from the subordinate entity (e.g., UE) to the scheduling entity (e.g., UE or BS). In some configurations, the control portion 702 may be a physical DL control channel (PDCCH).

As illustrated in FIG. 7, the end of the control portion 702 may be separated in time from the beginning of the UL data portion 704. This time separation may sometimes be referred to as a gap, guard period, guard interval, and/or various other suitable terms. This separation provides time for the switch-over from DL communication (e.g., reception operation by the scheduling entity) to UL communication (e.g., transmission by the scheduling entity). The UL-centric subframe may also include a common UL portion 706. The common UL portion 706 in FIG. 7 may be similar to the common UL portion 606 described above with reference to FIG. 6. The common UL portion 706 may additional or alternative include information pertaining to channel quality indicator (CQI), sounding reference signals (SRSs), and various other suitable types of information. One of ordinary skill in the art will understand that the foregoing is merely one example of an UL-centric subframe and alternative structures having similar features may exist without necessarily deviating from the aspects described herein.

In some circumstances, two or more subordinate entities (e.g., UEs) may communicate with each other using sidelink signals. Real-world applications of such sidelink communications may include public safety, proximity services, UE-to-network relaying, vehicle-to-vehicle (V2V) communications, Internet of Everything (IoE) communications, IoT communications, mission-critical mesh, and/or various other suitable applications. Generally, a sidelink signal may refer to a signal communicated from one subordinate entity (e.g., UE1) to another subordinate entity (e.g., UE2) without relaying that communication through the scheduling entity (e.g., UE or BS), even though the scheduling entity may be utilized for scheduling and/or control purposes. In some examples, the sidelink signals may be communicated using a licensed spectrum (unlike wireless local area networks, which typically use an unlicensed spectrum).

In communication systems operating according to new radio (NR) (e.g., 5G) standards, one or more control resource sets (coresets) for transmission of PDCCHs may be supported. A coreset may include one or more control resources (e.g., time and frequency resources) configured for conveying PDCCH. Within each corset, one or more search spaces (e.g., common search space, UE-specific search space, etc.) may be defined for a given UE. A coreset may be defined in units of resource element groups (REGs). Each REG may include a fixed number (e.g., twelve, or some other number) of tones in one symbol period (e.g., a symbol period of a slot), where one tone in one symbol period is referred to as a resource element (RE). A fixed number of REGs may be included in a control channel element (CCE) (e.g., a CCE may include six REGs, or some other number of REGs).

A NR-PDCCH may occupy one or more NR-CCEs. For NR-PDCCH, different numbers of NR-CCEs may form the resource for downlink control information (DCI). The number of NR-CCEs in a NR-PDCCH generally refers to the NR-PDCCH's aggregation level. The aggregation level generally configures the coverage of DCI and the amount of resource used for the DCI. Multiple sets of NR-CCEs may be defined as search spaces for UEs. For example, for NR-PDCCH, one or more search spaces may be defined, where each search space includes a set of decoding candidates with one or more aggregation levels. Thus, a gNB may transmit a NR-PDCCH to a UE by transmitting the NR-PDCCH in a set of CCEs that is defined as a decoding candidate within a search space for the UE. Likewise, the UE may receive the NR-PDCCH by searching in search spaces for the UE and decoding the NR-PDCCH transmitted by the gNB.

Example Polar Codes

As noted above, polar codes may be used to encode a stream of bits for transmission. Polar codes are a capacity-achieving coding scheme with almost linear (in block length) encoding and decoding complexity. Polar codes are widely considered as a candidate for error-correction in the next-generation wireless systems. Polar codes have many desirable properties such as deterministic construction (e.g., based on a fast Hadamard transform), very low and predictable error floors, and simple successive-cancellation (SC) based decoding.

Polar codes are linear block codes of length $N=2^n$ where their generator matrix is constructed using the $n^{th}$ Kronecker power of the matrix $$G^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} \quad \text{Eq. 1}$$

denoted by $G^n$. For example. Equation (1) shows the resulting generator matrix for n=3.

$$G = \begin{pmatrix} 1 & 0 \\ 1 & 1 \end{pmatrix},$$

A codeword may be generated by using the generator matrix to encode a number of input bits (e.g., information bits). For example, given a number of input bits $u=(u_0, u_1, \ldots, u_{N-1})$, a resulting codeword vector $x=(x_0, x_1, \ldots, x_{N-1})$ may be generated by encoding the input bits using the generator matrix G. This resulting codeword may then be rate matched and transmitted.

When the received vectors are decoded) using a Successive Cancellation (SC) decoder, every estimated bit, $\hat{u}_i$, has a predetermined error probability given that bits $u_0^{i-1}$ were correctly decoded, that tends towards either 0 or 0.5. Moreover, the proportion of estimated bits with a low error probability tends towards the capacity of the underlying channel. Polar codes exploit a phenomenon called channel polarization by using the most reliable K bits to transmit information, while setting, or freezing, the remaining (N-K) bits to a predetermined value, such as 0, for example as explained below.

For very large N, polar codes transform the channel into N parallel "virtual" channels for the N information bits. If C is the capacity of the channel, then there are almost N*C channels which are completely noise free and there are N(1−C) channels which are completely noisy. The basic polar coding scheme then involves freezing (i.e., not transmitting) the information bits to be sent along the completely noisy channel and sending information only along the perfect channels. For short-to-medium N, this polarization may not be complete in the sense there could be several channels which are neither completely useless nor completely noise free (i.e., channels that are in transition). Depending on the rate of transmission, these channels in the transition are either frozen or they are used for transmission.

In new radio (NR) as described above, polar codes may be used to encode information. For example, polar codes may be used as forward error correction (FEC) for control channels (e.g., 5G control channels). Generally, cyclic redundancy check (CRC) bits can be added in the polar codes (e.g., CRC-aided polar coding (CA-polar)) to improve the error rate performance and error detection. Generally, other types of "assistant bits" can also be used.

Because polar codes are linear block codes with a recursively constructed generator matrix, a polar code of length N is built from the concatenation of two constituent polar codes of length $N_v=N/2$. This recursive construction is carried out in a way that polarizes the probability of correctly estimating bits: some bit estimates become more reliable and others becomes less reliable. As the blocklength increases, some bit estimates become more reliable and the rest become less reliable.

Each polar code bit-channel (e.g., channel index) is assigned a reliability value, used to determine which bits transmit information and which parity. Relative reliabilities may be known (e.g., stored and/or computed) by both encoders and decoders. The relative order of reliabilities can be dependent on the code length and on the signal-to-noise ratio (SNR) for which the code has been constructed. The reliabilities associated with the bit-channels can be determined, for example, by using the Bhattacharyya parameter, through the direct use of probability functions, or other reliability computation.

In polar encoding, the most reliable channels (e.g., most reliable bit locations/positions) are typically selected to carry information (e.g., information bits), and the rest of the bits are set as a fixed value (e.g., zero). These fixed bits may be referred to as frozen bits.

Example Channel Aware Polar Code Construction

Figure 8:
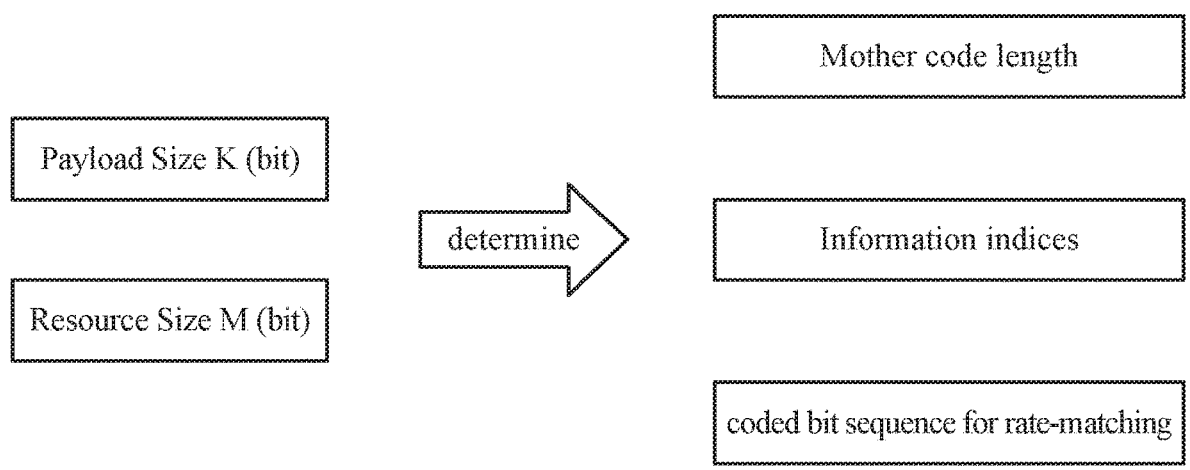
FIG. 8 illustrates conventional polar code parameter determination.

In conventional systems, polar code construction does not take into consideration varying channel conditions among sub-channels. For example, as illustrated in FIG. 8, polar code parameters, including the mother code length, information indices and sequence fed into the circular buffer for rate-matching, are typically determined by the payload size and the resource size.

Figure 9:
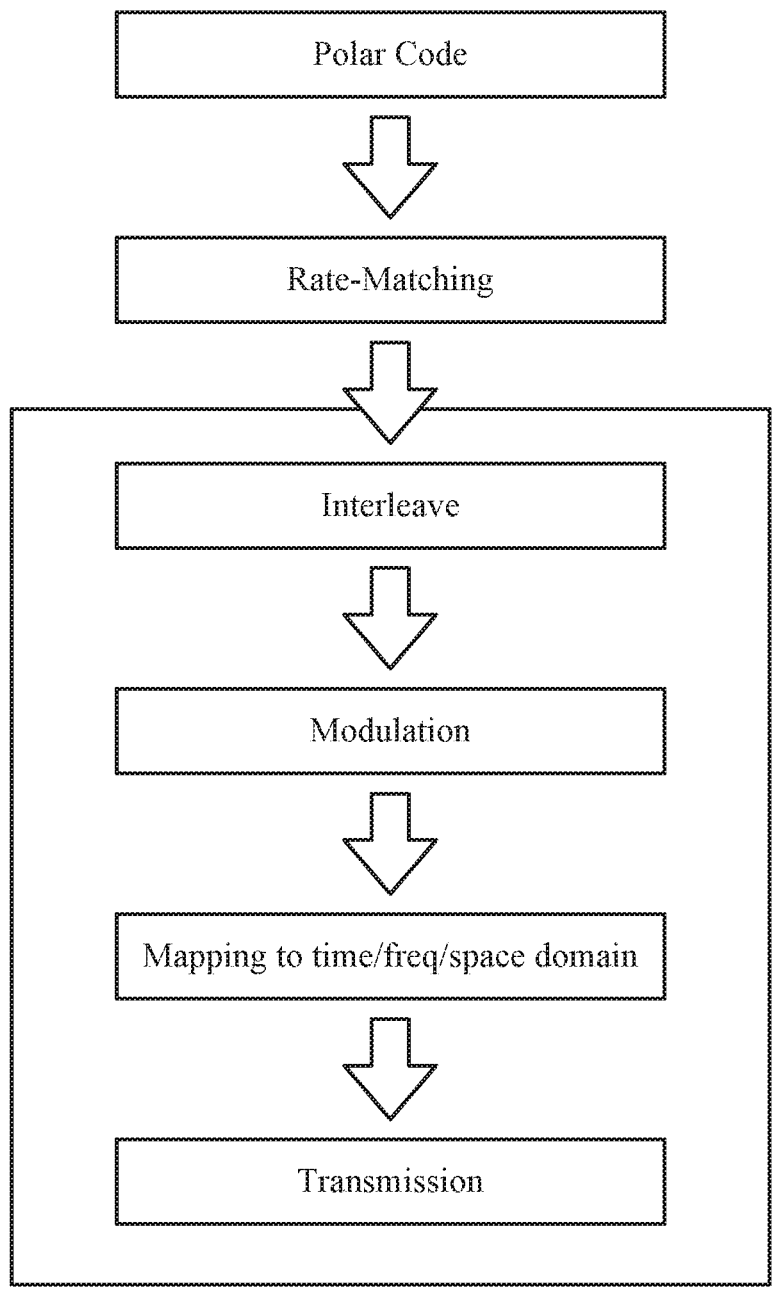
FIG. 9 illustrates an example block diagram of transmission processing with encoding using polar codes, in accordance with certain aspects of the present disclosure.

FIG. 9 illustrates an example block diagram of transmission processing with encoding using polar codes. As illustrated, after rate-matching the bit sequences are interleaved and modulated into symbols, then mapped on to time/frequency/space domain resources. For forward error correction (FEC) code purposes, the channel is assumed to be a Binary-input analog white Gaussian noise (AWGN) channel.

This assumption may be less than ideal and, in reality, the SNR is typically not stable for various reasons. For example, MIMO layers may have different power allocations, channels may be subject to Time/Frequency selective fading, and there may be different reliabilities between the bits modulated into a single symbol. For these various types of masons, the different coded bits from one code block (CB) may suffer significantly different SNRs.

Aspects of the present disclosure, however, provide techniques to select polar code parameters based on different channel conditions the different coded bits may experience. As such, polar code construction based on these techniques may be referred to a "channel aware" code construction.

Figure 10:
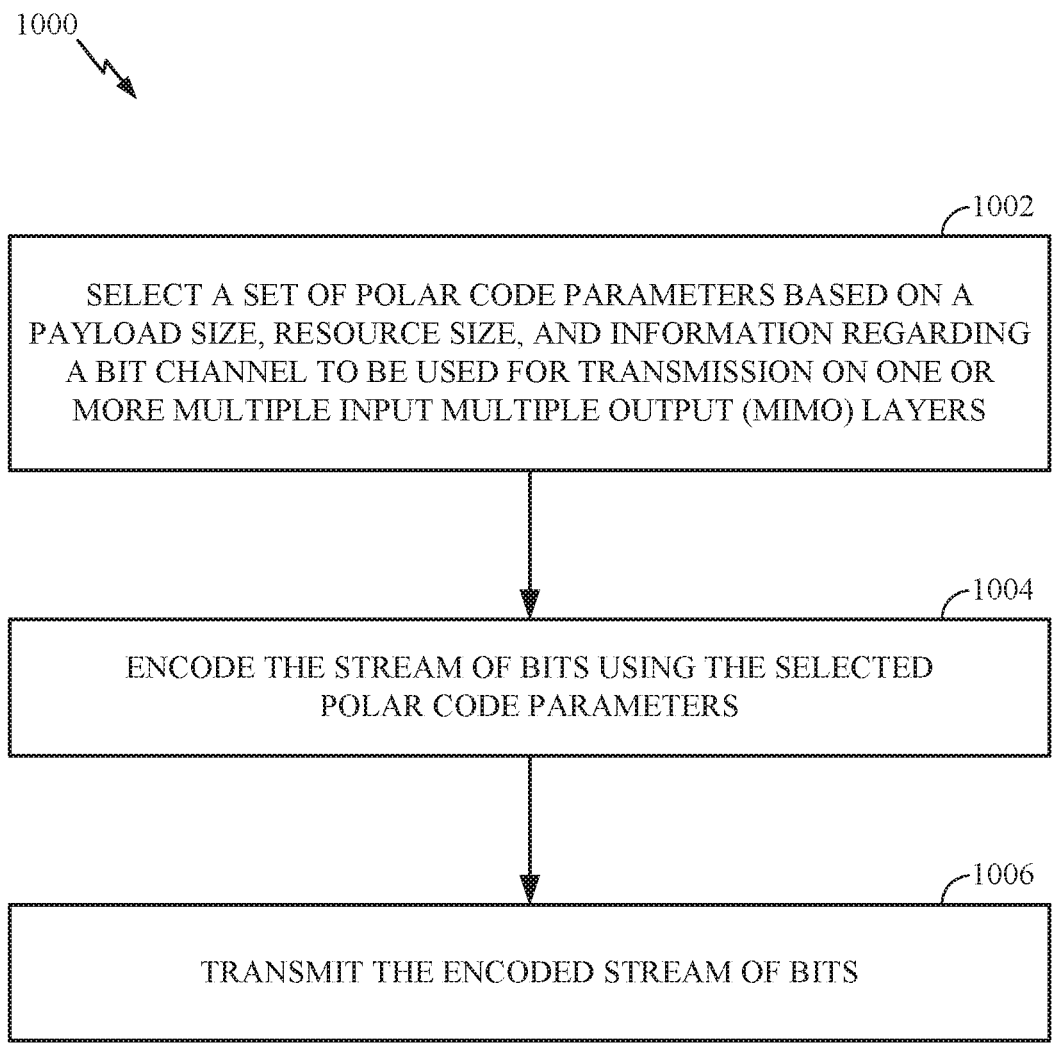
FIG. 10 illustrates example operations for wireless communications, in accordance with certain aspects of the present disclosure.

FIG. 10 illustrates example operations 1000 for wireless communications, in accordance with aspects of the present disclosure. Operations 1000 may be performed, for example, by a base station (e.g., a gNB to encode downlink control channel transmissions), such as BS 110 or a UE (e.g., to encode uplink control channel transmissions), such as UE 120, shown in FIG. 1.

Operations 1000 begin, at 1002, by selecting a set of polar code parameters based on a payload size resource size, and other information regarding a bit channel to be used for transmission on one or more multiple input multiple output (MMO) layers. At 1004, the stream of bits is encoded using the selected polar code parameters. As noted above, the encoded stream of bits could be, for example, for an uplink control channel transmission from a UE or a downlink control channel transmission from a base station. At 1006, the encoded stream of bits is transmitted.

Figure 11:
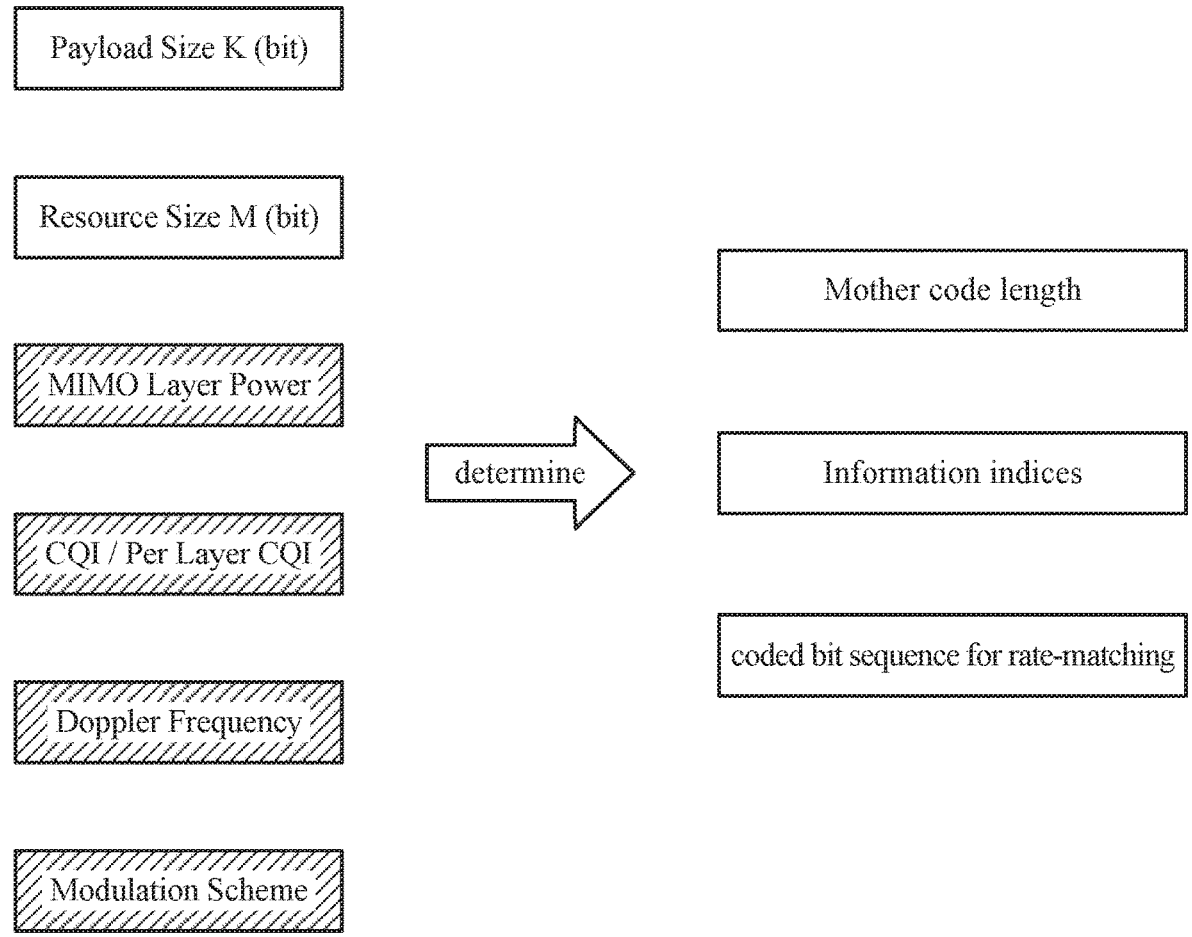
FIGS. 11-14 illustrate example options for channel-aware polar code parameter determination, in accordance with certain aspects of the present disclosure.

As illustrated in FIG. 11, the channel-aware polar code construction presented herein may involve various channel properties, in addition to payload size and resource size, when selecting polar code parameters. As illustrated, the polar codes parameters may include a mother code length, information indices, and an index sequence of coded bits for rate matching.

The channel information may include channel information comprises at least one of channel quality information (CQI) per layer, transmission power per layer, Doppler frequency information, or modulation order. The channel information may be represented as precise values of channel information per transmission layer, quantized values of channel information per transmission layer, or an order of binary input sub-channels in ascending or descending order of channel information.

Figure 12:
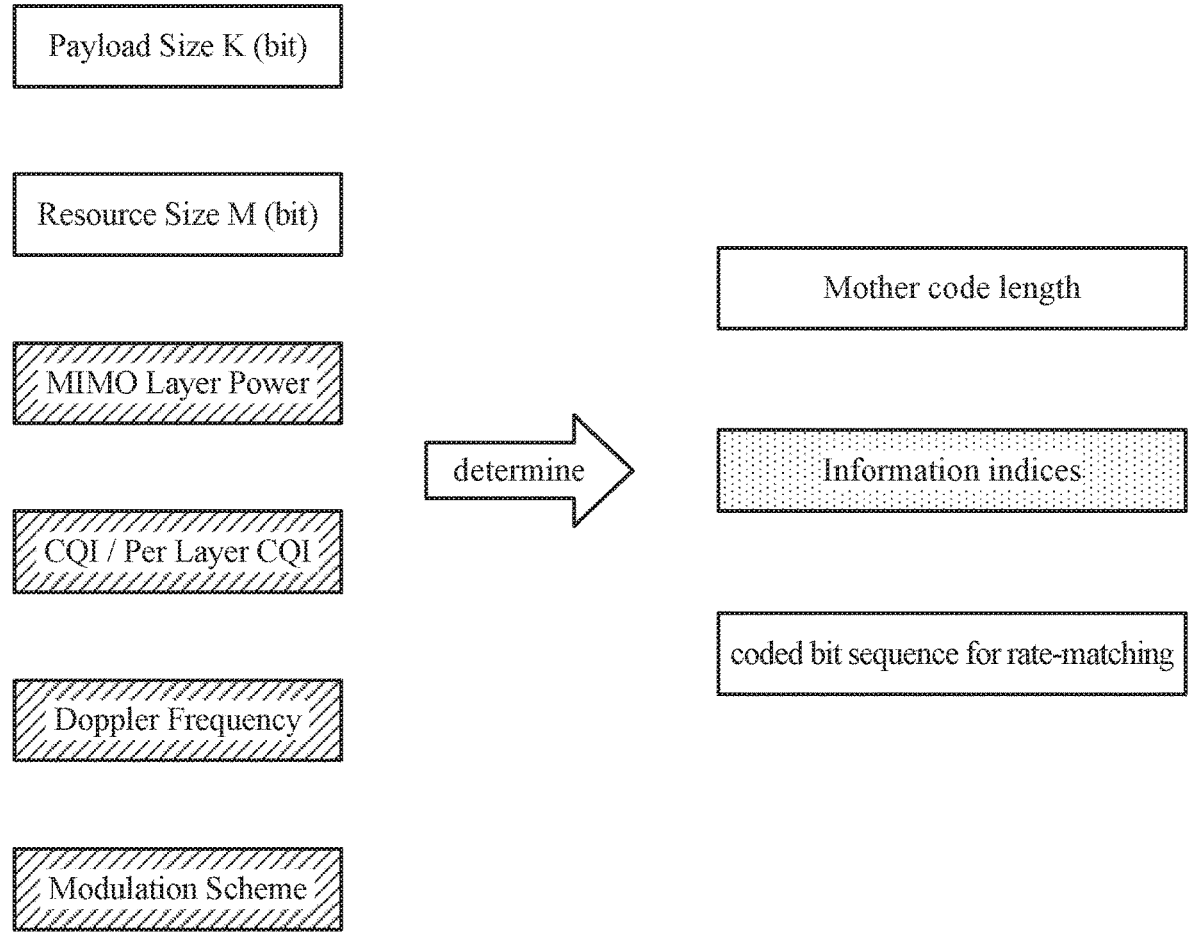
Figure 13:
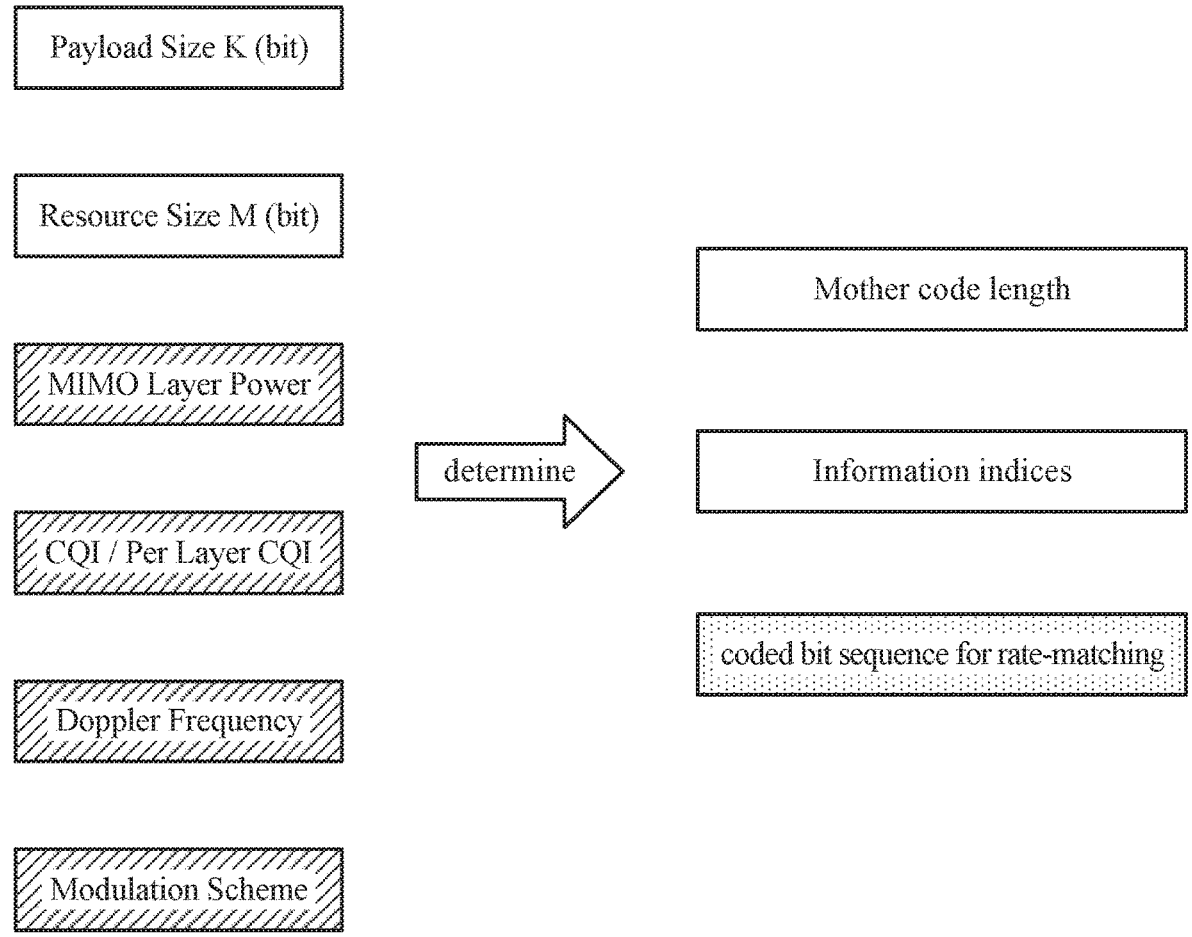
Figure 14:
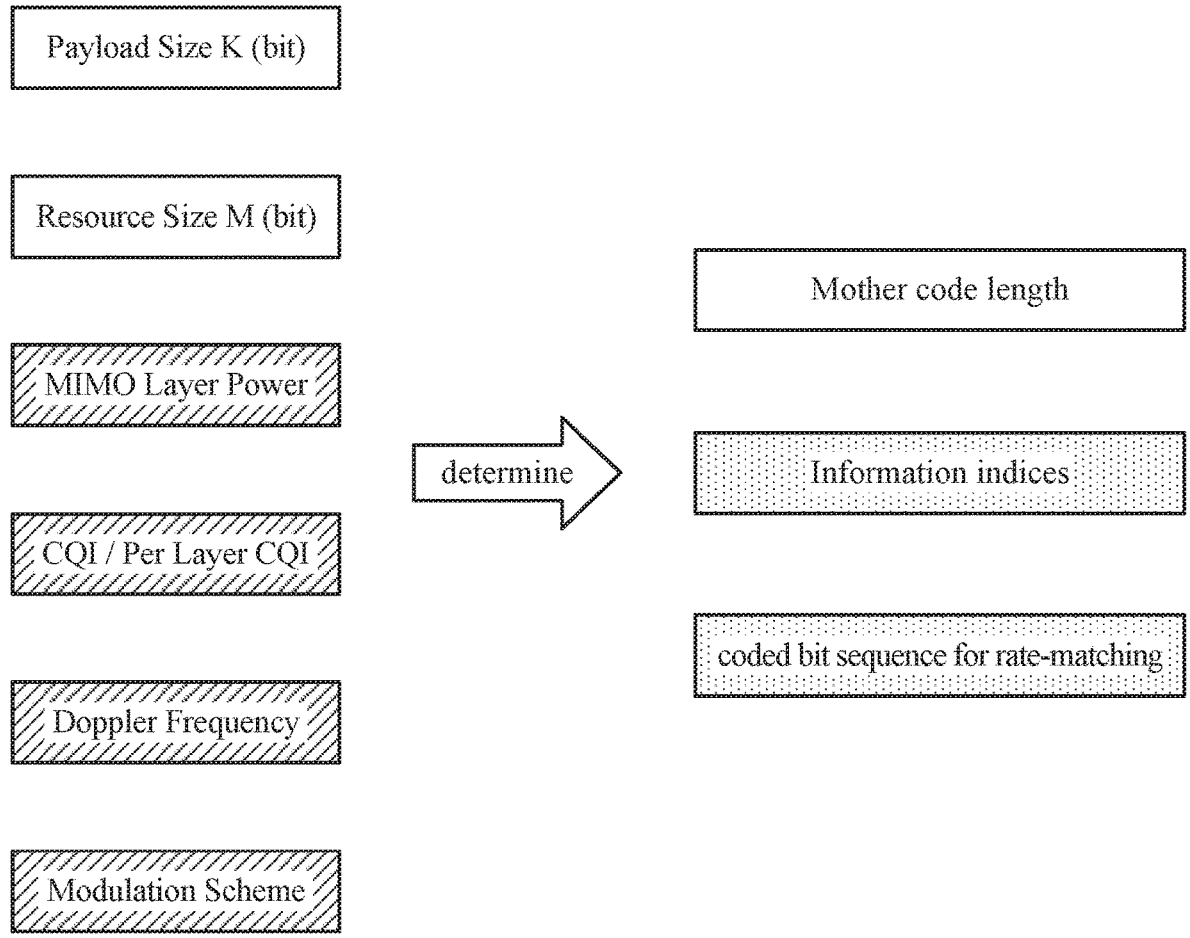

As illustrated in FIGS. 12-14, the exact polar code construction based on channel information may vary, based on a desired optimization.

As illustrated in FIG. 12, in some cases, the set of polar codes parameters comprises information indices selected to adjust information bit locations to fit bit blocks with different signal to noise ratios (SNRs).

As illustrated in FIG. 13, the set of polar codes parameters comprises an index sequence of coded bits for rate matching which are selected to map certain coded bits to at least one sub-block having a largest signal to noise ratio (SNR).

As illustrated in FIG. 14, an index sequence for rate matching may be selected to rearrange the coded bits sequence to achieve a target metric. For example, the target metric may be a target block error rate (BLER) and the coded bits may be rearranged in an effort to minimize expected BLER.

The channel-aware polar code construction presented herein may provide improved BLER performance under certain scenarios. Examples of such scenarios include when there are a relatively large number of spatial layers, larger bandwidth with significant freq-selective fading, faster UE movement with significant time-selective fading, and higher order modulation.

In some cases, how (and/or even if) the channel-aware polar code construction is performed may be configured via one or more signaling options. For example, what additional information (e.g., the particular parameters) is taken into account for polar code construction and/or how the parameters are considered may be conveyed via radio resource control (RRC) or other type signaling. In some cases, a configuration may be provided via RRC signaling, while updates may be provided via MAC control elements (CEs).

In some cases, channel-aware polar code construction may be triggered dynamically. As an example, for channel aware polar code construction for uplink control channels or data channels, DCI or some other type of activation may be used to indicate this kind of signaling for channel-aware determination of code construction.

In some cases, which of the options described above is enabled may be signaled dynamically. For example, such signaling may indicate whether code bits are rearranged, a code bit sequence is adjusted for rate matching, and/or if different information indices are selected. Such flexibly signaling may allow particular coding mechanism to be adapted to meet certain objectives (e.g., potentially determining information bit indices for a particular rate matching related design).

For a MIMO case, signaling may be used to potentially indicate, for example, if channel aware polar code construction is used for data transmission, to signal a number of layers transmitted, and/or can also signal additional information on layers relative to SNR for construction. Signaling may also indicate polar code construction dependent on MCS level for each CW and/or different layer adjustments.

From a signaling point of view, MCS levels or any other signaling that impacts a UE decision on modulation order or MIMO layers layer/power associated signaling could also be taken into account. Additional parameters, such as Doppler frequency may be jointly encoded/mapped with an indication of another parameter format (e.g., to jointly consider MIMO signaling for CQI/Doppler/Modulation scheme).

In general, the objective of such signaling is for one side to provide signaling that indicates that parameter (or different types of parameters) to consider when coding, so the other side knows the approach being used. As noted, signaling may also be used to activate/de-activate channel-aware coding.

In some cases, a device may also provide an indication of whether it supports channel aware polar code construction. For example, a UE may provide such an indication as part of its capability information so that a base station may know whether or not it supports signaling/activation or not.

The methods described herein include one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). As used herein, including in the claims, the term "and/or," when used in a list of two or more items, means that any one of the listed items may be employed by itself, or any combination of two or more of the listed items may be employed. For example, if a composition is described as containing components A, B, and/or C, the composition may contain A alone; B alone; C alone; A and B in combination; A and C in combination; B and C in combination; or A, B, and C in combination.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." For example, the articles "a" and "an" as used in this application and the appended claims should generally be construed to mean "one or more" unless specified otherwise or clear from the context to be directed to a singular form. Unless specifically stated otherwise, the term "some" refers to one or more. Moreover, the term "or" is intended to mean an inclusive "or" rather than an exclusive "or." That is, unless specified otherwise, or clear from the context, the phrase, for example, "X employs A or B" is intended to mean any of the natural inclusive permutations. That is, for example the phrase "X employs A or B" is satisfied by any of the following instances: X employs A; X employs B; or X employs both A and B. All structural and functional equivalents to the elements of the various aspects described throughout this disclosure that are known or later come to be known to those of ordinary skill in the art are expressly incorporated herein by reference and are intended to be encompassed by the claims. Moreover, nothing described herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components.

For example, operations 1000 shown in FIG. 10 may be performed by processors shown in FIG. 4, including transmit processor 420, TX MIMO processor 430, or receive processor 438 of the base station 110 and/or the transmit processor 464, TX MIMO processor 466, or receive processor 458 of the user equipment 120.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may include a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, phase change memory, ROM (Read Only Memory), PROM (Programmable Read-Only Memory). EPROM (Erasable Programmable Read-Only Memory). EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may include a single instruction, or many instructions, and may be distributed over several different code segments, among different programs, and across multiple storage media. The computer-readable media may include a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-Ray® disc where disks usually reproduce data magnetically, while discs reproduce data optically with lasers. Thus, in some aspects computer-readable media may include non-transitory computer-readable media (e.g., tangible media). In addition, for other aspects computer-readable media may include transitory computer-readable media (e.g., a signal). Combinations of the above should also be included within the scope of computer-readable media.

Thus, certain aspects may include a computer program product for performing the operations presented herein. For example, such a computer program product may include a computer-readable medium having instructions stored (and/or encoded) thereon, the instructions being executable by one or more processors to perform the operations described herein. For example, instructions for performing the operations described herein and illustrated in FIG. 10.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method of wireless communication, comprising:
   selecting a set of one or more polar code parameters based on a payload size, a resource size, and information regarding a bit channel to be used for transmission on one or more multiple input multiple output (MIMO) layers comprising at least channel quality information (CQI) per layer and transmission power per layer;
   encoding a stream of bits using the selected set of one or more polar code parameters; and
   transmitting the encoded stream of bits on the one or more MIMO layers.

2. The method of claim 1, wherein the information regarding the bit channel comprises at least one of:
   precise values of channel information per transmission layer;
   quantized values of channel information per transmission layer; or
   an order of binary input sub-channels in ascending or descending order of channel information.

3. The method of claim 1, wherein the information regarding the bit channel comprises at least one of:
   Doppler frequency information;
   modulation order; or
   modulation and coding selection (MCS) level.

4. The method of claim 1, wherein the set of one or more polar code parameters comprises at least one of:
   a mother code length;
   information indices; or
   an index sequence of coded bits for rate matching.

5. The method of claim 4, wherein:
the set of one or more polar code parameters comprises information indices selected to adjust information bit locations to fit bit blocks with different signal to noise ratios (SNRs).

6. The method of claim 4, wherein:
the set of one or more polar code parameters comprises an index sequence of coded bits for rate matching which are selected to map certain coded bits to at least one sub-block having a largest signal to noise ratio (SNR).

7. The method of claim 4, wherein:
the set of one or more polar code parameters comprises an index sequence for rate matching selected to rearrange the coded bits sequence to achieve a target metric.

8. The method of claim 7, wherein:
the target metric comprises a target block error rate (BLER) for a corresponding set of information indices.

9. The method of claim 8, wherein the set of information indices is selected to adjust information bit locations to fit bit blocks with different signal to noise ratios (SNRs).

10. The method of claim 1, further comprising receiving signaling indicating a configuration for selecting the set of one or more polar code parameters based on the payload size, the resource size, and the information regarding the bit channel.

11. The method of claim 10, wherein the configuration indicates what type of parameters are included in the information regarding the bit channel.

12. The method of claim 10, wherein the configuration is received via radio resource control (RRC) signaling.

13. The method of claim 1, further comprising receiving signaling that activates or deactiavates selecting the set of one or more polar code parameters based on the payload size, the resource size, and the information regarding the bit channel.

14. The method of claim 13, wherein the signaling is provided via at least one of downlink control information (DCI) or media access control (MAC) control element (CE) signaling.

15. The method of claim 1, further comprising providing signaling indicating support for selecting the set of one or more polar code parameters based on the payload size, the resource size, and the information regarding the bit channel.

16. An apparatus for wireless communication, comprising:
means for selecting a set of one or more polar code parameters based on a payload size, a resource size, and information regarding a bit channel to be used for transmission on one or more multiple input multiple output (MIMO) layers comprising at least channel quality information (CQI) per layer and transmission power per layer;
means for encoding a stream of bits using the selected set of one or more polar code parameters; and
means for transmitting the encoded stream of bits on the one or more MIMO layers.

17. The apparatus of claim 16, wherein the information regarding the bit channel comprises at least one of:
precise values of channel information per transmission layer;
quantized values of channel information per transmission layer; or
an order of binary input sub-channels in ascending or descending order of channel information.

18. The apparatus of claim 16, wherein the information regarding the bit channel comprises at least one of:
Doppler frequency information;
modulation order; or
modulation and coding selection (MCS) level.

19. The apparatus of claim 16, wherein the set of one or more polar code parameters comprises at least one of:
a mother code length;
information indices; or
an index sequence of coded bits for rate matching.

20. The apparatus of claim 19, wherein the set of one or more polar code parameters comprises at least one of:
information indices selected to adjust information bit locations to fit bit blocks with different signal to noise ratios (SNRs);
an index sequence of coded bits for rate matching which are selected to map certain coded bits to at least one sub-block having a largest signal to noise ratio (SNR); or
an index sequence for rate matching selected to rearrange the coded bits sequence to achieve a target metric.

21. The apparatus of claim 20, wherein:
the target metric comprises a target block error rate (BLER) for a corresponding set of information indices.

22. The apparatus of claim 21, wherein the set of information indices is selected to adjust information bit locations to fit bit blocks with different signal to noise ratios (SNRs).

23. The apparatus of claim 16, further comprising means for receiving signaling indicating a configuration for selecting the set of one or more polar code parameters based on the payload size, the resource size, and the information regarding the bit channel.

24. The apparatus of claim 23, wherein the configuration indicates what type of parameters are included in the information regarding the bit channel.

25. The apparatus of claim 23, wherein the configuration is received via radio resource control (RRC) signaling.

26. The apparatus of claim 16, further comprising means for receiving signaling that activates or deactiavates selecting the set of one or more polar code parameters based on the payload size, the resource size, and the information regarding the bit channel.

27. The apparatus of claim 26, wherein the signaling is provided via at least one of downlink control information (DCI) or media access control (MAC) control element (CE) signaling.

28. The apparatus of claim 16, further comprising means for providing signaling indicating support for selecting the set of one or more polar code parameters based on the payload size, the resource size, and the information regarding the bit channel.

29. An apparatus for wireless communication, comprising:
at least one processor configured to select a set of one or more polar code parameters based on a payload size, a resource size, and information regarding a bit channel to be used for transmission on one or more multiple input multiple output (MIMO) layers and encode a stream of bits using the selected set of one or more polar code parameters comprising at least channel quality information (CQI) per layer and transmission power per layer; and
a transmitter configured to transmit the encoded stream of bits on the one or more MIMO layers.

30. A non-transitory computer readable medium having instructions stored thereon for:
selecting a set of one or more polar code parameters based on a payload size, a resource size, and information regarding a bit channel to be used for transmission on one or more multiple input multiple output (MIMO)

layers comprising at least channel quality information (CQI) per layer and transmission power per layer;

encoding a stream of bits using the selected set of one or more polar code parameters; and transmitting the encoded stream of bits on the one or more MIMO layers.

* * * * *